United States Patent
Budach et al.

(10) Patent No.: US 9,863,760 B2
(45) Date of Patent: Jan. 9, 2018

(54) METHOD AND DEVICE FOR DETERMINING A REFERENCE POINT OF AN ORIENTATION MARKING ON A SUBSTRATE OF A PHOTOLITHOGRAPHIC MASK IN AN AUTOMATED MANNER

(71) Applicant: Carl Zeiss SMT GmbH, Oberkochen (DE)

(72) Inventors: Michael Budach, Hanau (DE); Ralf Schönberger, Wiesbaden (DE); Michael Jöst, Gross-Gerau (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 212 days.

(21) Appl. No.: 14/899,979

(22) PCT Filed: Jun. 16, 2014

(86) PCT No.: PCT/EP2014/062533
§ 371 (c)(1),
(2) Date: Dec. 18, 2015

(87) PCT Pub. No.: WO2014/202517
PCT Pub. Date: Dec. 24, 2014

(65) Prior Publication Data
US 2016/0138907 A1    May 19, 2016

(30) Foreign Application Priority Data

Jun. 18, 2013    (DE) .................. 10 2013 211 403

(51) Int. Cl.
*G01B 11/14*    (2006.01)
*G03F 9/00*    (2006.01)
*G03F 7/20*    (2006.01)

(52) U.S. Cl.
CPC .......... *G01B 11/14* (2013.01); *G03F 7/70141* (2013.01); *G03F 9/7007* (2013.01); *G03F 9/7088* (2013.01)

(58) Field of Classification Search
CPC ..................................................... G01B 11/14
(Continued)

(56) References Cited

U.S. PATENT DOCUMENTS

| | | | |
|---|---|---|---|
| 4,857,742 A | 8/1989 | Kato et al. | |
| 4,893,346 A * | 1/1990 | Bishop | G06T 7/001 382/147 |

(Continued)

FOREIGN PATENT DOCUMENTS

| | | | |
|---|---|---|---|
| DE | 37 44320 | 7/1988 | ............... G01D 5/28 |
| JP | H0513306 | 1/1993 | |
| JP | 2004-111473 | 4/2004 | ........... H01L 21/027 |

OTHER PUBLICATIONS

German Office Action for German Application No. 10 2013 211 403.6 by dated Feb. 4, 2014 (8 pages).

(Continued)

*Primary Examiner* — Tarifur Chowdhury
*Assistant Examiner* — Omar Nixon
(74) *Attorney, Agent, or Firm* — Fish & Richardson P.C.

(57) ABSTRACT

The invention relates to a method for automated determination of a reference point of an alignment mark on a substrate of a photolithographic mask, which method comprises the following steps: (a) performing a first line scan within a start region of the substrate in a first direction on a surface of the substrate, the alignment mark being arranged within the start region, for locating a first element of the alignment mark; (b) performing a second line scan within the start region in at least a second direction, which intersects the first direction, on the surface of the substrate for (Continued)

locating a second element of the alignment mark; (c) estimating the reference point of the alignment mark from the located first element and the located second element of the alignment mark; and (d) imaging a target region around the estimated reference point of the alignment mark in order to determine the reference point of the alignment mark, with the imaging being carried out at a higher resolution than the performance of the line scans in steps (a) and (b).

25 Claims, 15 Drawing Sheets

(58) Field of Classification Search
    USPC .......................................................... 356/401
    See application file for complete search history.

(56) References Cited

U.S. PATENT DOCUMENTS

| | | | |
|---|---|---|---|
| 4,949,284 A * | 8/1990 | Watanabe | B41F 33/0036 |
| | | | 101/365 |
| 4,962,423 A * | 10/1990 | Yamada | G03F 9/70 |
| | | | 382/144 |
| 5,849,441 A | 12/1998 | Nara et al. | |
| 6,925,203 B1 | 8/2005 | Tanaka | |
| 7,567,699 B2 | 7/2009 | Hansen | |
| 2004/0121069 A1 | 6/2004 | Ferranti et al. | |
| 2004/0150823 A1 * | 8/2004 | Yamamoto | G01B 11/272 |
| | | | 356/401 |
| 2004/0189995 A1 * | 9/2004 | Tanaka | G03F 9/7003 |
| | | | 356/401 |
| 2005/0205781 A1 | 9/2005 | Kimba | |
| 2006/0232777 A1 | 10/2006 | Finarov et al. | |
| 2008/0151234 A1 | 6/2008 | Imai et al. | |
| 2009/0268179 A1 * | 10/2009 | Park | G03B 27/32 |
| | | | 355/53 |
| 2011/0075123 A1 | 3/2011 | Nagamori | |
| 2014/0302429 A1 * | 10/2014 | Shoki | G03F 1/24 |
| | | | 430/5 |

OTHER PUBLICATIONS

German Office Action for German Application No. 10 2013 211 403.6 dated Aug. 11, 2016 (6 pages).
International Preliminary Report on Patentability for International Application No. PCT/EP2014/062533 dated Dec. 23, 2015.
International Search Report for International Application No. PCT/EP2014/062533 dated Jan. 9, 2015.
G. Klose et al., "PROVE™ a Photomask Registration and Overlay Metrology System for the 45 nm node and beyond", *Proceedings of SPIE*, vol. 7028, pp. 702832-1-702832-6 (2008).

* cited by examiner

FIG. 3       (Prior Art)

METHOD AND DEVICE FOR DETERMINING A REFERENCE POINT OF AN ORIENTATION MARKING ON A SUBSTRATE OF A PHOTOLITHOGRAPHIC MASK IN AN AUTOMATED MANNER

CROSS REFERENCE TO RELATED APPLICATIONS

This application is a National Stage application under 35 U.S.C. §371 of International Application PCT/EP2014/062533 having a filing date of Jun. 16, 2014, which claims priority to German Application 10 2013 211 403.6, filed on Jun. 18, 2013, the entire contents of which are herein incorporated by reference.

TECHNICAL FIELD

The present invention relates to a method and a device for automated determination of a reference point of an alignment mark on a substrate of a photolithographic mask.

PRIOR ART

Photolithography masks need to image ever-smaller structures on wafers as a result of the increasing integration density in the semiconductor industry (Moore's Law). In order to produce the small structure dimensions imaged on the wafer, there is an increasing need for more complicated processing processes.

As for photolithography, the trend toward increasing integration density is taken into account by virtue of the exposure wavelength of the lithography machines being shifted to ever-shorter wavelengths. In lithography machines, use is currently often made of an ArF (argon fluoride) excimer laser as a light source, which emits at a wavelength of approximately 193 nm. Currently, lithography systems which use electromagnetic radiation in the EUV (extreme ultraviolet) wavelength range (in the region of 10 nm to 15 nm) are under development.

Secondly, the increasing integration density in the semiconductor industry is taken into account by decreasing the structure dimensions of the imaging elements on photolithographic masks. Both factors lead to the demands on photomasks, which are already very high these days, increasing further.

For the reasons presented above, the production process of photomasks requires extreme outlay in terms of resources and time. This is reflected in high costs for an individual mask. For a complete set of masks for producing a complicated semiconductor component, the costs multiply with the number of masks required for the complete production of the semiconductor component. Depending on the complexity of the production process, a set of masks can comprise a range of approximately 20 to 50 individual masks.

Hence, exposure masks are repaired whenever this is possible. First of all, defects may occur during the mask production process, which defects are corrected after the detection thereof. Secondly, defects may occur in individual masks of a set of masks during the use of the masks in the production of semiconductor components, which defects need to be corrected so that the whole set of masks does not become worthless.

As a result of the problems described above, the correction of mask defects, i.e. the correction of the absorber elements arranged on the mask substrate, is likewise difficult. A first problem prior to the actual repair process lies in locating one of the marks which are applied to the corners of the mask substrate for the purposes of aligning the mask in relation to the mask-internal coordinate system. FIG. 1 schematically shows that photomasks have one or more alignment marks, which serve as reference point(s) for the mask-internal coordinate system. In the example in FIG. 1, the point of intersection of the two elements of the cross, which form an "L", could serve as reference point of the alignment mark.

As indicated by the horizontal and vertical arrow, the alignment mark can be subject to a variation of up to ±500 μm relative to the outer edges of the photomask. This means that, in an extreme case, defect-free absorber elements can be displaced by up to one millimeter from one mask to the next.

A photomask to be repaired is removed from a transport box by a robot and placed onto a sample stage. FIG. 2 shows the variations with which the robot places masks onto a sample stage over time. The position deviation from the mean value once again is approximately ±500 μm.

Despite these variations, the alignment mark still comes to rest within the field of view of e.g. a microscope, for example an electron-beam microscope, in advantageous cases and it can therefore be identified in a simple manner. However, in a multiplicity of disadvantageous constellations, the alignment mark does not fall within the field of view of the microscope used for the examination. Hence, it is necessary to search a region of the mask substrate, the dimensions of which may comprise several millimeters, with the microscope at a high resolution in order to locate an alignment mark on a photomask. This search process must currently be carried out manually and it is very time-consuming.

The obvious solution to this dilemma—namely the increase in the field of view of the microscope to the detriment of the resolution—does not lead anywhere. FIG. 3 shows a field of view of an electron-beam microscope extending over several hundred micrometers. The alignment mark can only be identified with great difficulties in FIG. 3.

The present invention is therefore based on the problem of specifying a method and a device for determining a reference point of an alignment mark on a substrate of a photolithographic mask, which avoid a manual search for the alignment mark.

SUMMARY OF THE INVENTION

In accordance with one exemplary embodiment of the present invention, this problem is solved by a method as claimed in claim 1. In one embodiment, the method for automated determination of a reference point of an alignment mark on a substrate of a photolithographic mask comprises the following steps: (a) performing a first line scan within a start region of the substrate in a first direction on a surface of the substrate, the alignment mark being arranged within the start region, for locating a first element of the alignment mark; (b) performing a second line scan within the start region in at least a second direction, which intersects the first direction, on the surface of the substrate for locating a second element of the alignment mark; (c) estimating the reference point of the alignment mark from the located first element and the located second element of the alignment mark; and (d) imaging a target region around the estimated reference point of the alignment mark in order to determine the reference point of the alignment mark, with the imaging being carried out at a higher resolution than the performance of the line scans in steps (a) and (b).

The method according to the invention exploits the geometric form of alignment marks. These typically have two elongate elements which are at right angles to one another. The two elements have macroscopic dimensions in a plane. However, the defined method for automated determination of a reference point of an alignment mark is not restricted to alignment marks, the elements of which form a right angle or the elements of which are straight lined. Rather, the method according to the invention can be applied to any alignment marks having two elongate elements which form an angle differing from 0°.

The method according to the invention breaks the determination of a reference point of an alignment mark down into two sub-processes. The first one consists of locating of the alignment mark. To this end, the two-dimensional search process is broken down into two coupled one-dimensional search processes. What this renders possible is the automation of the search process. Moreover, the two coupled one-dimensional search processes are preferably performed at a resolution adapted to the structure dimensions of the alignment mark. Locating the alignment mark is accelerated by the combination of automation and adapted resolution.

Imaging the target region for determining the reference point of the alignment mark is then carried out at a higher resolution such that the reference point can be determined with the required accuracy. Hence, the defined method optimizes the determination of the reference point of an alignment mark both in terms of time and in terms of accuracy.

In one aspect, the method furthermore comprises the following steps: (e) performing a third and fourth line scan within an intermediate region around the estimate of the reference point of the alignment mark after step (c), with the intermediate region being smaller than the start region and larger than the target region; (f) re-estimating the reference point of the alignment mark from renewed locating of the first element and the second element of the alignment mark by the third line scan and fourth line scan; and (g) performing step (d) using the new estimate of the reference point.

According to a further aspect, the method furthermore comprises the following step: repeating steps (e) to (f) for renewed estimation of the reference point with a position inaccuracy below a predetermined threshold. In another aspect, the predetermined threshold is 100 μm, preferably 20 μm, more preferably 5 μm and most preferably 1 μm.

The defined method renders it possible to repeat the two coupled one-dimensional search processes in order thereby to achieve an initial accuracy required for the second sub-process. Here, the two sub-processes can be carried out in such a way that the time for determining the reference point of the alignment mark becomes as short as possible.

In a further aspect, the method furthermore comprises the following steps: (h) performing a third and fourth line scan within the start region and outside of an intermediate region around the estimate of the reference point of the alignment mark after step (c), with the intermediate region being smaller than the start region and larger than a target region; (i) re-estimating the reference point of the alignment mark from renewed locating of the first element and the second element of the alignment mark by the third line scan and fourth line scan; and (j) performing step (d) using the new estimate of the reference point.

Preferably, step (c) of the method comprises the following: comparing the first line scan and the second line scan with stored reference marks.

Resorting to available reference marks increases the precision when estimating the reference point of the alignment marks. This is the case, in particular, when the reference marks have more details than can be reproduced by the resolution with which the first and second line scan are carried out or if the reference mark should have ambiguities.

Determining the reference point likewise preferably has a position inaccuracy of <10 μm, preferably <1 μm, more preferably <300 nm and most preferably <100 nm.

In another aspect, the method furthermore has the following steps: (k) shifting the start region if no reference point is estimated in step (c); and (l) repeating steps (a), (b) and (c).

The defined method can be configured in such a way that it autonomously and systematically searches a predetermined area of the mask substrate in a manner adapted to the form of an alignment mark. Dividing the area into partial areas can in this case be selected in a manner dependent on the shape of the alignment mark and the two-dimensional distribution of the alignment mark(s).

In accordance with a further aspect, performing the first and the second line scan comprises the use of a confocal spectroscopic reflectometer. According to another advantageous aspect, performing the first and the second line scan comprises the use of the confocal spectroscopic reflectometer without preceding focusing.

As a result, the time-consuming focusing of the light beam of the confocal spectroscopic reflectometer onto the surface of the substrate can be dispensed with.

In yet another aspect, the method comprises the following step: setting the signal-to-noise ratio of the first and the second line scan by means of the distance between the substrate of the photolithographic mask and an output lens of the confocal spectroscopic reflectometer.

By selecting an appropriate wavelength range for the detection of the radiation reflected by the substrate surface, the signal-to-noise ratio of the radiation reflected by the reference mark can be optimized when a reflecting reference mark is present.

According to an advantageous aspect, the imaging of the target region comprises the use of a scanning electron microscope and/or a focused ion beam microscope and/or a light microscope.

In yet a further preferred aspect, a device for automated determination of a reference point of an alignment mark on a substrate of a photolithographic mask comprises: (a) means for performing a first line scan and a second line scan within a start region of the substrate in a first direction on a surface of the substrate, with the alignment mark being arranged within the start region, for locating a first element and a second element of the alignment mark; (b) means for estimating the reference point of the alignment mark from the first and the second element of the alignment mark; and (c) means for imaging a target region around the estimated reference point of the alignment mark for determining the reference point of the alignment mark, wherein the means for imaging the target region has a higher resolution than the means for performing the first line scan and the second line scan.

In another aspect, the means for performing a first line scan and a second line scan has a lateral spatial resolution <100 μm, preferably <50 μm, more preferably <20 μm and most preferably <10 μm.

In accordance with a further aspect, the means for performing a first line scan and a second line scan comprises means for local scanning of the surface of the substrate.

In a further advantageous aspect, the means for carrying out a first line scan and a second line scan comprises: (d) a sensor embodied to direct focused electromagnetic radiation onto the substrate and to receive electromagnetic radiation reflected and/or transmitted by the substrate; (e) a scanning unit embodied to scan the sensor and/or the substrate in a plane perpendicular to the focused electromagnetic radiation; and (f) a control unit connected to the sensor and embodied to determine a local intensity distribution from the electromagnetic radiation received by the sensor.

In another aspect, the control unit is furthermore connected to the scanning unit and embodied for open-loop or closed-loop control of the scanning unit.

In accordance with a further aspect, the scanning unit has a spatial resolution <20 µm, preferably <10 µm, more preferably <1 µm and most preferably <0.5 µm.

In one advantageous aspect, the sensor comprises a confocal spectroscopic reflectometer. According to an advantageous aspect, the sensor is embodied to perform the first and second line scan without preceding focusing. In another advantageous aspect, the signal-to-noise ratio of the first and the second line scan is set by means of the distance between the substrate of the photolithographic mask and an output lens of the confocal spectroscopic reflectometer.

According to a preferred aspect, the means for imaging the target region has a spatial resolution <200 nm, preferably <50 nm, more preferably <10 nm and most preferably <2 nm.

In yet another aspect, the means for imaging the target region comprises a scanning electron microscope and/or a focused ion beam microscope and/or a light microscope.

In accordance with an advantageous aspect, the means for estimating the reference point of the alignment mark comprises a processor configured to estimate the reference point of the alignment mark from the located first and second elements and/or to determine the reference point of the alignment mark from the imaging of the target region.

Finally, in yet a further aspect, the means for estimating the reference point of the alignment mark comprises a memory for storing reference marks.

DESCRIPTION OF THE DRAWINGS

Currently preferred exemplary embodiments of the invention are described in the following detailed description with reference being made to the drawings, in which.

DETAILED DESCRIPTION OF PREFERRED EXEMPLARY EMBODIMENTS

Currently preferred embodiments of the method according to the invention and the device according to the invention are explained in more detail below. These are carried out using the example of aligning transmissive photolithographic masks. However, the method according to the invention and the device according to the invention are not restricted to the use of transmissive photomasks. Rather, they can likewise be used for automated determination of reference points of reflective masks such as EUV masks.

Furthermore, the method according to the invention can be used, in general, for the automated determination of reference marks or alignment marks. In particular, it is for example possible by way of the defined method to determine reference marks on wafers in an automated form in order, for example, to align a scanner or a stepper for the purposes of exposing the wafer in respect to these marks.

Figure 1:
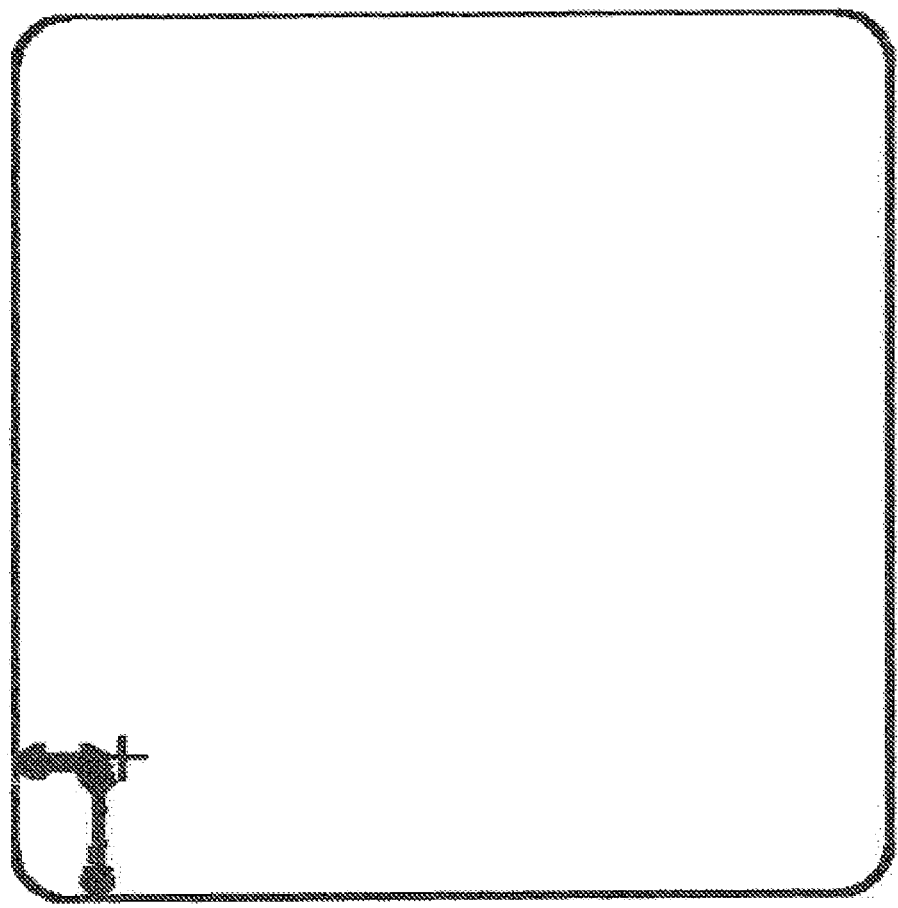
FIG. 1 shows a top view of a substrate of a mask, which has an alignment mark.
Figure 2:
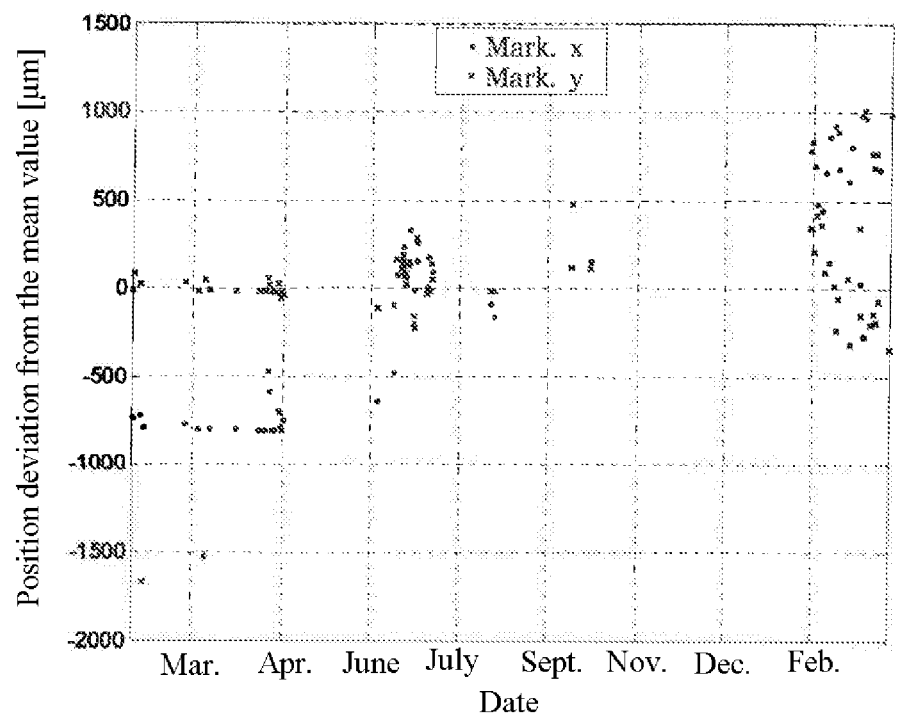
FIG. 2 depicts a distribution of a placement of a mask on a sample stage by a robot.
Figure 3:
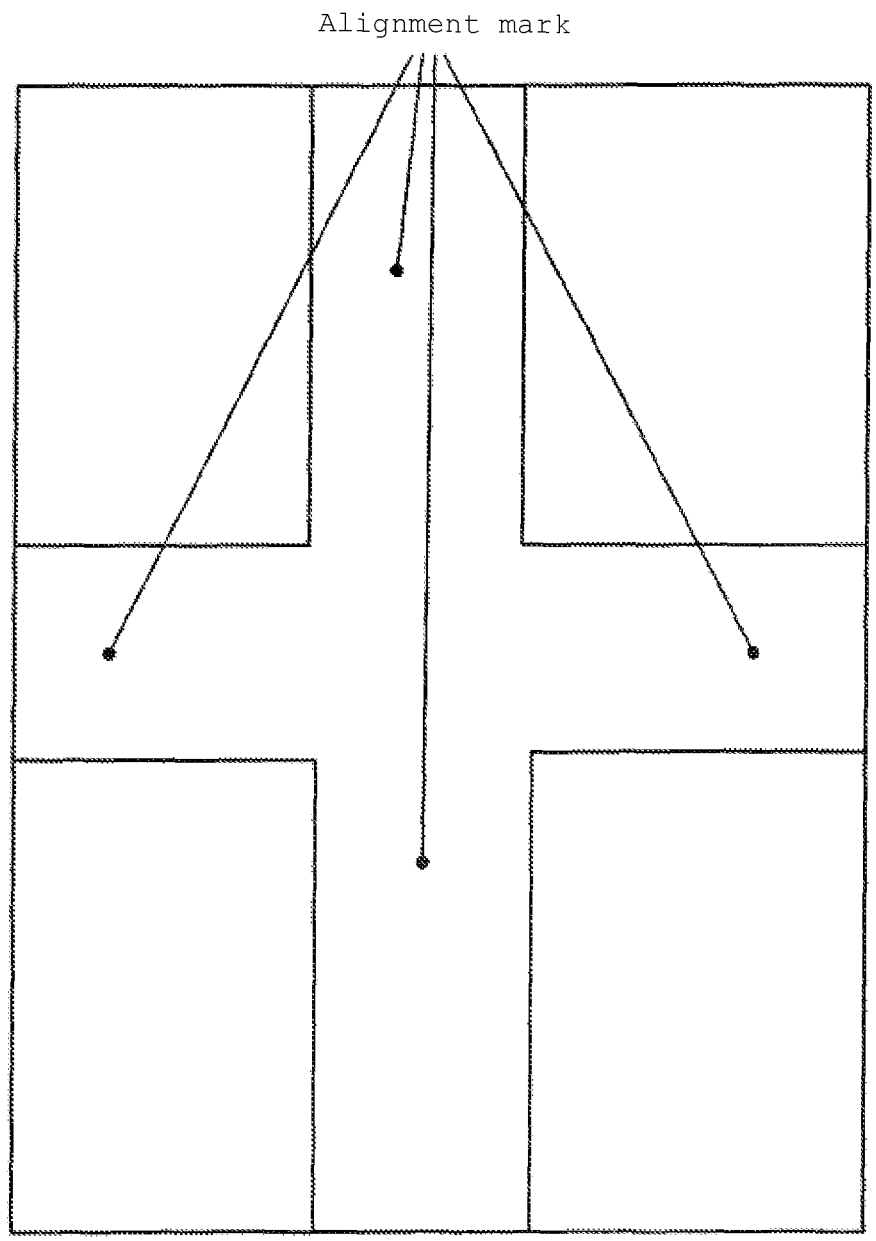
FIG. 3 reproduces a section of a top view of the substrate of a mask, which has an alignment mark.
Figure 4:
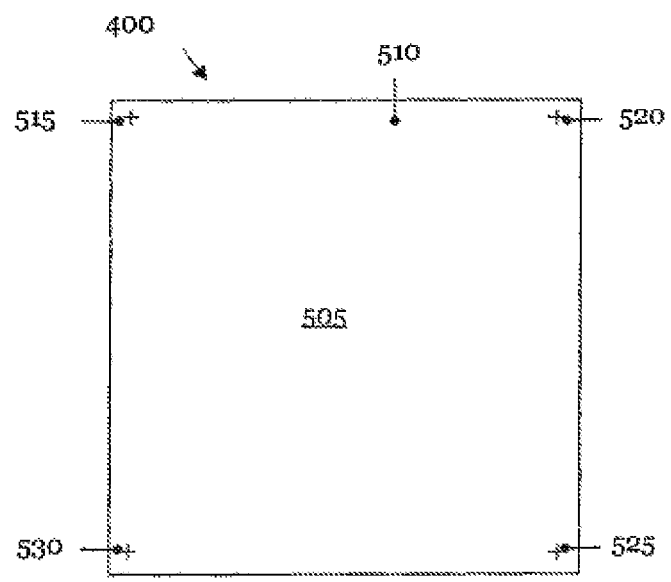
FIG. 4 shows a schematic view of the substrate of a photomask, in the corners of which respectively one alignment mark in the form of a cross is mounted.

The image 400 in FIG. 4 shows a schematic illustration of the top view of a substrate 505 of a photolithographic mask, a photomask or a mask 510 for short. Currently, the substrate 505 is preferably a quartz substrate. Other materials can likewise be used for producing a substrate, such as e.g. ultra low expansion glass (e.g. ULE®), low thermal expansion glass or glass ceramic (e.g. Ceran® or LTEM®) or other suitable materials with a low coefficient of thermal expansion. Currently, use is often made of square photomasks with a dimension of 6 inches. The method described below can naturally be used for aligning photomasks with different dimensions.

In the vicinity of the four corners, the substrate 505 of the square mask 510 has reference marks or alignment marks 515, 520, 525 and 530 in the form of crosses. The alignment marks in cross form depicted here are merely exemplary. The method presented in this application can be used for all currently conventional reference marks for aligning photomasks. In addition to crosses, which often still comprise further elements such as e.g. squares, angles are currently also used frequently as alignment marks, which are arranged at the four corners of the substrate 505 of the mask 510 (not depicted in FIG. 4).

The method presented here is independent of the form of the alignment mark provided that this has elements with a macroscopic extent in two directions that are not collinear. Thus, the lengths of the bars of the crosses or the elements of the alignment marks 515, 520, 525 and 530 of the substrate 504 are typically in the millimeter range. By contrast, the widths thereof are merely a few micrometer range.

By way of example, an alignment mark 515, 520, 525, 530 can be applied to the substrate 505 of the mask 510 in the form of an absorber element. Alternatively, it is likewise possible to etch an alignment mark into a region of the mask 510, the substrate 505 of which is covered by an absorber material such as e.g. chromium. In the case of a scan with a scanning electron microscope and/or with a focused ion beam microscope, these embodiments also have a topology contrast component in addition to a material contrast. Moreover, it is possible to etch the alignment marks 515, 520, 525 and 530 into the substrate 505 of the mask 510. For this exemplary embodiment of an alignment mark, the image of a scanning electron microscope or of a focused ion beam microscope merely has a topology contrast.

Figure 5:
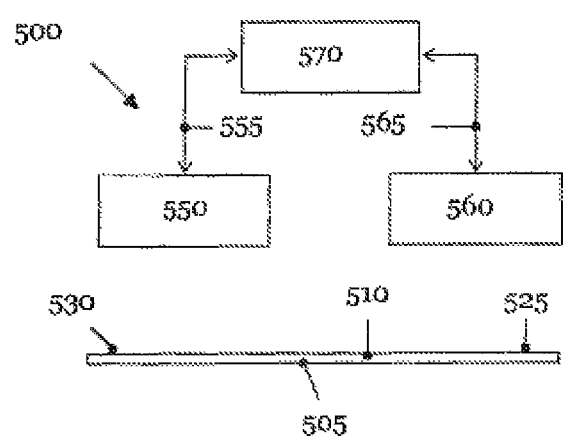
FIG. 5 exemplifies a schematic overview of a device for automated determination of a reference point of an alignment mark.

FIG. 5 schematically provides an overview of the parts of a device 500 for automated determination of a reference point of an alignment mark 515, 520, 525 and 530. The lower part of FIG. 5 shows a section through the substrate 505 of the photomask 510 of FIG. 4 in the region of the alignment marks 525 and 530. The first device 550 is designed to perform line scans in the regions of the substrate 505 in which the alignment marks 525 and 530 are mounted. Locating one of the alignment marks 525 or 530 or 515 or 520 may be sufficient for the subsequent mask repair process. However, at least two of the alignment marks 515, 520, 525 and 530 are often examined in order to establish possible skewing of the substrate 505 of the mask 510 in addition to a displacement. Furthermore, it is possible to analyze more than two alignment marks 515, 520, 525 and 530 in order to take into account higher-order effects for the subsequent mask repair.

The measurement data from the line scans are transmitted from the first device 550 to the computer or control unit 570 by way of the connection 555. By way of example, the computer or control unit 570 can be configured in the form of a microprocessor or in the form of a computer system. In the example depicted in FIG. 5, the computer or control unit 570 establishes an estimate for a reference point of the alignment mark 525 or 530 from the data of the line scans. Using this estimate, the computer unit 570 controls the second device 560 by way of the connection 565, which second device operates at a higher resolution than the first device 550 such that the second device 560 scans a region around the estimated reference point of the alignment mark 525, 530—or the target region. From the measurement data of the second device 560, which in turn are transmitted to the computer unit 570 by way of the connection 565, the computer unit 570 determines the reference point of the alignment mark 525 or 530.

Figure 6:
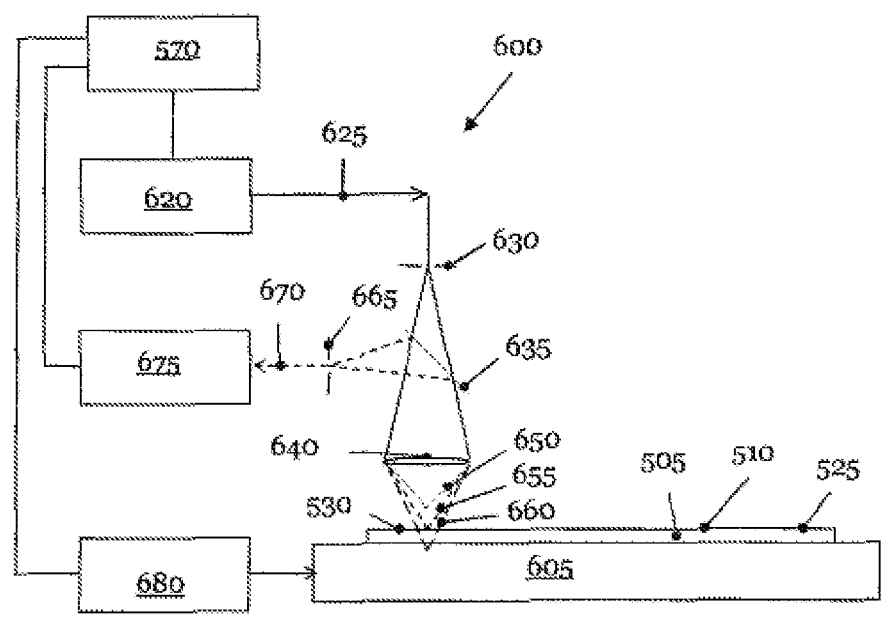
FIG. 6 exemplifies a schematic overview of some components of a confocal spectroscopic reflectometer for performing line scans.

FIG. 6 schematically shows an example of the first device 550 of FIG. 5 for performing line scans. A confocal spectroscopic reflectometer 600 is depicted schematically in the example of FIG. 6. This measurement machine is only an example of a class of measurement machines that can be used for locating the elements of an alignment mark. In general, use can be made of a profilometer, i.e. a measurement machine for two-dimensional or three-dimensional measurement of microscopic or sub-microscopic surface topographies. In addition to a machine operating in a tactile manner, which e.g. scans the surface of the substrate 505 with a diamond needle, it is also possible to use profilometers which operate using optical processes (such as e.g. laser profilometry or white light interferometry) and thus scan the surface contactlessly.

The substrate 505 of the photomask 510, which has the alignment marks 515, 520, 525 and 530, is placed onto a sample stage 605. The sample stage 605 can be moved in a defined manner in a plane (xy-plane) by a scanning unit 680. By way of example, micromanipulators or servomotors (not shown in FIG. 6) can be used to move the sample stage 605. The resolution of the movement of the scanning unit 680 in the x-direction and in the y-direction should lie in the order of one micrometer. In the case of a stationary photomask 510, the scanning unit 680 can alternatively scan the confocal spectroscopic reflectometer 600 over the surface of the photomask 510 instead of scanning the sample stage 605. Furthermore, a combined movement of the photomask 510 and the reflectometer 600 is possible.

A white-light source 620 of the confocal spectroscopic reflectometer 600 is directed through an optical fiber 625 and the stop 630 onto a lens or a lens system 640, which is not color-compensated and therefore dispersive. In the example depicted in FIG. 6, the lens system 640 focuses the blue component 650 of the white-light source 620 in front of the surface of the substrate 505 of the mask 510. On the other hand, the focal point of the lens system 640 lies behind the surface of the mask substrate 505 for the red component 660 of the white light of the white-light source 620 due to the dispersion. The distance between the output lens of the confocal spectroscopic reflectometer 600 and the substrate 505 of the mask 510 is just set in such a way in the example depicted in FIG. 6 that the green wavelength component 655 of the white-light source 620 is focused onto the surface of the mask substrate 505. The surface of the mask substrate 505 reflects a certain component of the green light 655 back into the lens system 640. By way of a semitransparent beam splitter 635, the reflected light is imaged onto the stop 665 and from there it reaches the spectrometer 675 directly or, as shown in FIG. 6, with the aid of an optical waveguide 670. The spectrometer 675 analyzes the light reflected by the mask substrate 505 spectrally.

If the light from the white-light source 620 falls onto the alignment mark 530 during a movement of the sample stage 605, this changes the focal condition due to a step in the height profile of the surface of the substrate 505. Moreover, the alignment mark 530 generally has a different material (for example chromium) to the surroundings thereof (e.g. quartz). The two different materials generally have a different reflectivity. If the alignment mark 530 has a depression, this shifts the focus in the direction of the red region of the wavelength spectrum of the white-light source 620. The spectrometer 675 detects a spectral displacement of the light reflected by the alignment mark 530 toward longer wavelengths. By contrast, if the alignment mark is applied to the mask substrate in the form of an absorber structure, the incidence of the white light on the alignment mark 530 shifts the reflected light detected by the spectrometer 675 toward the blue end of the spectrum of the white-light source 620. If only a small wavelength range around the focal condition (i.e. of the green wavelength component 655 in the example of FIG. 6) is observed on the substrate 505 of the mask 510 by means of the spectrometer 675, the incidence of the light from the white-light source 620 at the alignment mark 530 leads to a reduction in the intensity of the reflected light in the observed wavelength range for both exemplary embodiments.

The resolution of a confocal spectroscopic reflectometer 600 for determining the topology of a surface reaches down into the single-digit nanometer range and it is therefore more than enough for locating an alignment mark.

The lateral resolution of the confocal spectroscopic reflectometer 600 depends on the diameter of the stops 630 and 665 and reaches the single-digit micrometer range. As already mentioned above, the elements of the alignment mark 530 have a width in the region of a few micrometers. As a result, confocal spectroscopic reflectometers are able to detect conventional alignment marks.

Figure 7:
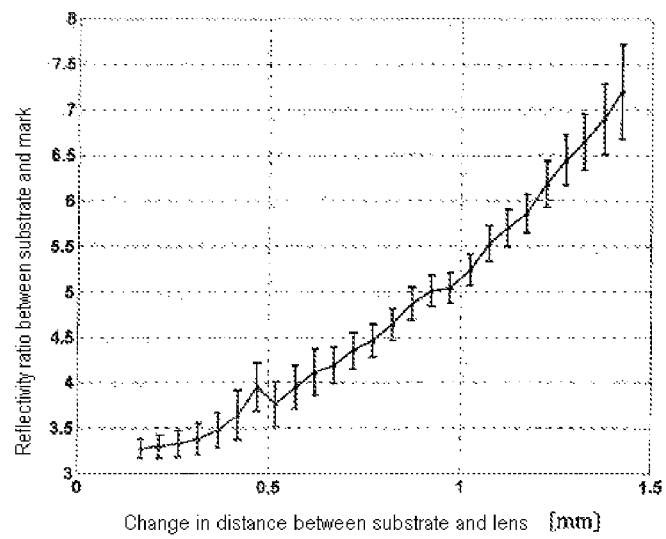
FIG. 7 reproduces a diagram which depicts the change in the reflectivity ratio between the mask substrate and an alignment mark.

FIG. 7 shows how it is possible to set the reflectivity ratio of the surface of the substrate to the surface of the alignment mark 530 by the selection of the distance between the confocal spectroscopic reflectometer 600 and the surface of the mask substrate 505, and hence by the selection of the color of the light of the white-light source 620 in the focus on the substrate surface. As a result of this, it is possible to select the wavelength range of the white-light source 620 used for the measurement depending on the material of the mask substrate 505 and the alignment mark 530 and/or the topology of the transition from the substrate 505 to the alignment mark 530.

The distance between the surface of the mask substrate 505 and the confocal spectroscopic reflectometer 600 is approximately 15 mm in the example of FIG. 7. By changing the distance by approximately 1.3 mm, it is possible to improve the reflectivity ratio by more than a factor of two. This is accompanied by a corresponding improvement in the signal-to-noise ratio of the output signal of the spectrometer 675 of FIG. 6. For the example of a transition from the mask substrate 505 to the alignment mark 530, depicted in FIG. 7, the displacement of the employed wavelength range into the red portion of the white light from the white-light source 620 improves the reflectivity ratio by approximately a factor of two.

Figure 8:
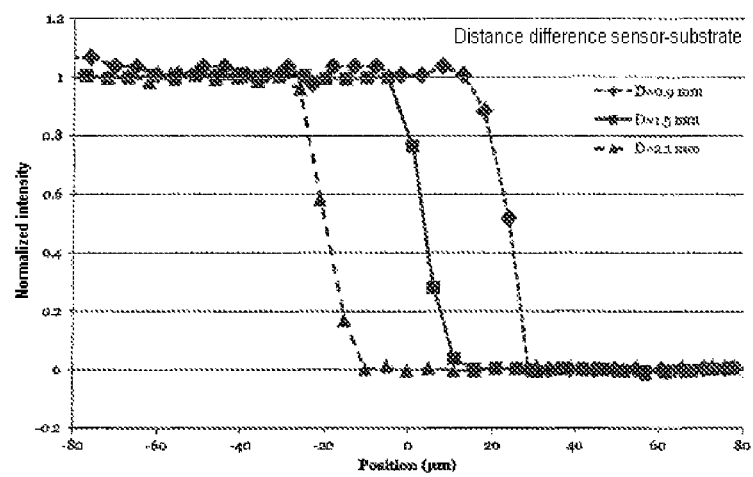
FIG. 8 presents three intensity profiles of the mask substrate-alignment mark transition, which were measured by the confocal spectroscopic reflectometer with different distances from the surface of the mask substrate.

FIG. 8 represents intensity distributions of three transitions from an absorber material—this is chromium in the example depicted in FIG. 8—to the substrate 505, which is quartz in the depicted example. In the example of FIG. 8, and also in the examples discussed thereafter, the alignment mark 530 was etched into the absorber material on the substrate 505 of the mask 510. The thickness of the absorber layer is approximately 70 nm and the width of the elements or the bars of the alignment mark 530 lies in the region of approximately 5 µm.

The example in FIG. 8 does not reproduce the substrate 505/alignment mark 530/substrate 505 transition, but rather reproduces a transition from absorber material to a wide region of the substrate that is freed from the absorber. The right-hand curve in FIG. 8 shows the intensity change in the reflected light when the focus of the red portion 660 of the light from the white-light source 620 lay on the surface of the mask substrate 505. Accordingly, the central and the left-hand curve show the intensity profile of the topology jump and the material transition from the substrate surface to the level of the alignment mark 530 when the focus of the green portion 655 and of the blue portion 650 lay on the surface of the substrate 505 of the mask 510. The distance between the confocal spectroscopic reflectometer 600 and the surface of the substrate 505 was reduced by 1.2 mm from the right-hand curve to the left-hand curve in FIG. 8.

What can be gathered from the curves in FIG. 8 is that the gradient of, or the decrease in, the three curves is substantially independent of the employed wavelength range of the white-light source 620. These circumstances have the great advantage that the confocal spectroscopic reflectometer 600 can be used for locating the alignment mark 530 without complicated preceding focusing. As a result, the identification of the alignment mark 530 is accelerated significantly. The lateral resolution of the employed confocal spectroscopic reflectometer 600 (80%-20% definition) lies in the region of 8 µm.

Referring again to FIG. 6, the white-light source 620 and the spectrometer 675 are connected to the computer or control unit 570. The computer or control unit 570 can control or regulate both the white-light source 620 and the spectrometer 675. Furthermore, the computer unit 570 obtains the measured spectral intensity distributions from the spectrometer 675. Moreover, the scanning unit 680 is likewise connected to the computer or control unit 570 and can therefore control the line scans of the white-light source 620 of the confocal spectroscopic reflectometer 600.

Figure 9:
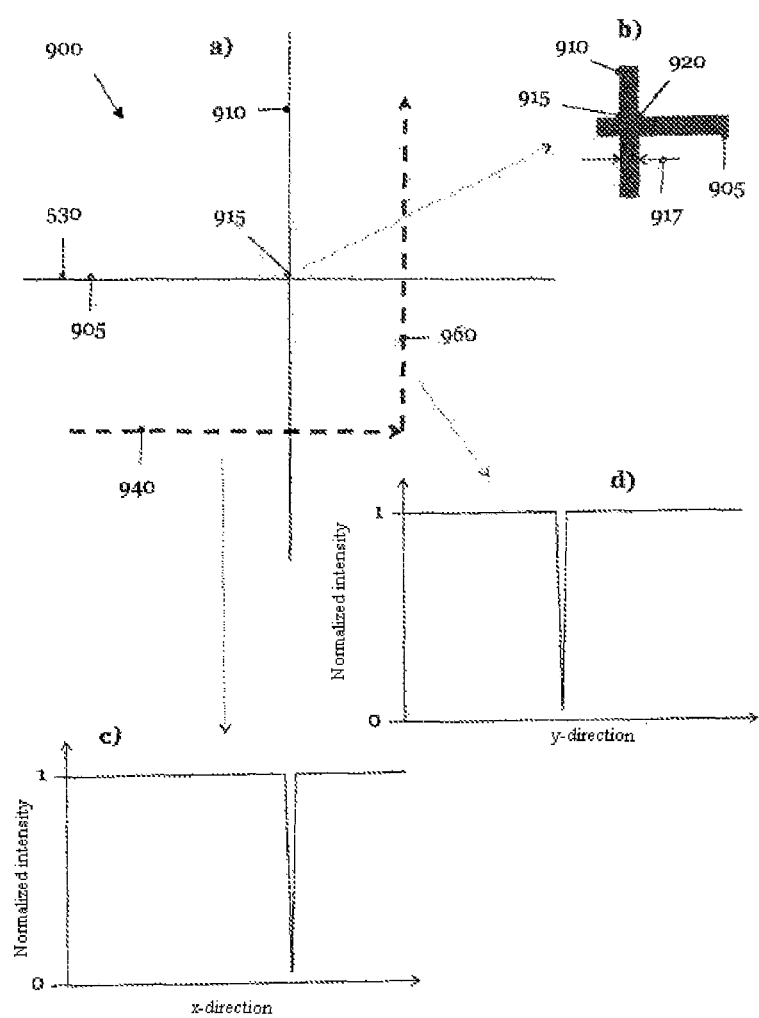
FIG. 9*a* exemplifies an alignment mark with two line scans.
FIG. 9*b* depicts a magnified section of the center of the alignment mark from FIG. 9*a*.
FIG. 9*c* reproduces the intensity profile of the first line scan of FIG. 9*a*.
FIG. 9*d* specifies the intensity profile of the second line scan of FIG. 9*a*.

FIG. 9a presents a magnified section 900 of the top view of the substrate 505 of the mask 510 in FIG. 5, which contains the alignment mark 530. As already mentioned above, the alignment mark 530 has the form of a cross with a first horizontal element 905 and a second vertical element 910. The lengths of the first 905 and of the second element 910 lie in the order of one millimeter. The center 915 of the alignment mark 530 in FIG. 9a is once again depicted in a magnified manner in FIG. 9b, which is found top left. The width 917 of the first 905 and the second element 910 lie at approximately 5 µm in the discussed example. The left-hand upper corner of the cross of the first 905 and of the second element 910 of the alignment mark 530 marks the reference point 920 of the alignment mark 530 in the example of FIG. 9.

The dashed horizontal line in FIG. 9a denotes the first line scan 940 of the confocal spectroscopic reflectometer 600. FIG. 9c schematically depicts, in a normalized form, the intensity profile detected during the first line scan 940 by the spectrometer 675 of the confocal spectroscopic reflectometer 600. When the light beam from the white-light source 620 of the reflectometer 600 impinges on the second element 910 of the alignment mark 530, the intensity in the reflected light changes, due to mainly the material difference between the alignment mark 530 and the substrate and due to the focus condition modified by the second element 910 of the absorber mark 530. The latter effect depends decisively on the thickness of the absorber mark 530 and is small in relation to the effect of the material difference for thin absorber marks (<100 nm). This is registered by the spectrometer 675 by way of a collapse in the intensity in the wavelength range which satisfies the focus condition for the surface of the mask substrate 505.

After the first line scan 940 has reached its predetermined length, a second line scan 960 at an angle of 90° is performed in the example depicted in FIG. 9, starting from the endpoint of the first line scan 940. In the example depicted in FIG. 9, the second line scan 960, along the predetermined path thereof, impinges on the first element 905 of the alignment mark 530. FIG. 9d exemplifies the normalized intensity profile measured along the path during the second line scan 960.

The spectrometer 675 of the reflectometer 600 transmits the detected intensity profiles of the first 940 and of the second line scans 960 to the computer or control unit 570. The latter establishes a first estimate for the reference point 920 of the alignment mark 530 from these data.

If the first line scan 940, along the predetermined path thereof, does not impinge upon the second element 905 of the alignment mark 530, the computer unit 570, with the aid of the scanning unit 680, displaces the substrate 505 according to a selectable algorithm by an adjustable value in the horizontal direction or in the vertical direction or in the horizontal and vertical direction. Thereupon, the first line scan 940 is repeated. In the case where the first line scan 940 locates the second element 910 of the alignment mark 530 but the second line scan 960, along the path thereof, does not impinge upon the first element 905 of the alignment mark 530, the computer or control unit 570 displaces the path of the second line scan 960 in the vertical direction by a predetermined path length and causes a repetition of the second line scan 960.

For the purposes of estimating the reference point 920 of the alignment mark 530, it is not necessary for the first 940 and the second line scan 960 to be at right angles in relation to one another. Rather, all that the presented method requires is that the two line scans 940 and 960 are not parallel to one another. However, it is advantageous for the accuracy of the determination of the reference point of the alignment mark to adapt the directions of the two line scans 940 and 960 to the symmetry of the alignment mark. Furthermore, it is not necessary for the line scans 940 and 960 to extend along a straight line. Rather, the line scans 940 and 960 can follow curved trajectories. In particular, it is conceivable to embody the two line scans 940, 960 as a semicircle.

Figure 10:
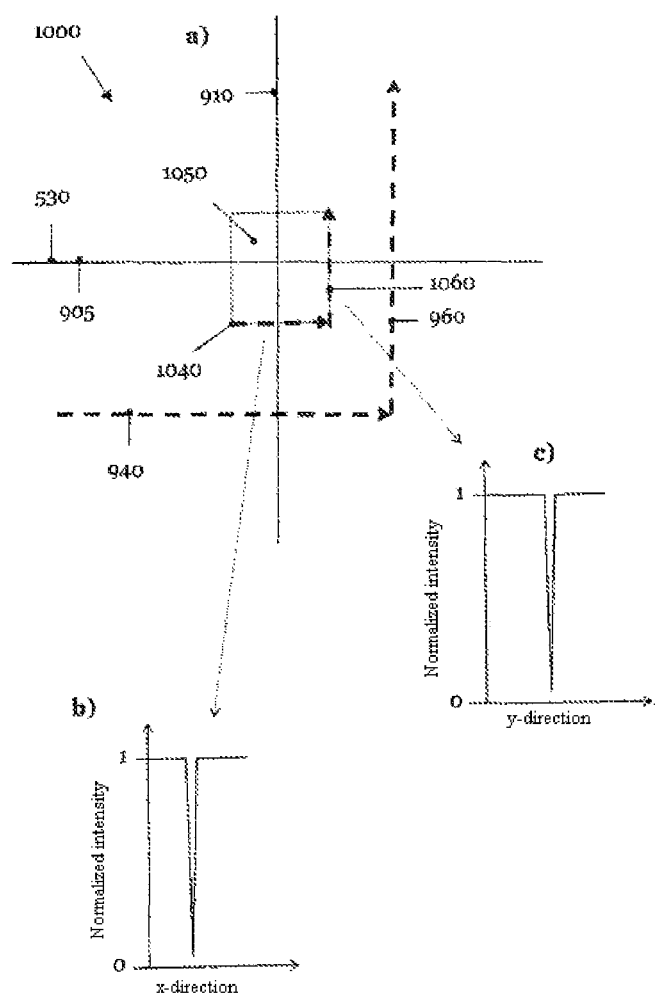
FIG. 10*a* depicts, in an exemplified manner, the alignment mark of FIG. 9*a* with a third and a fourth line scan.
FIG. 10*b* shows the intensity profile of the third line scan of FIG. 10*a*.
FIG. 10*c* represents the intensity profile of the fourth line scan of FIG. 10*a*.

If necessary, the estimate of the reference point 920 of the alignment mark 530 can be refined by further line scans. To this end, the computer or control unit 960 establishes an intermediate region 1050, which is depicted in FIG. 10a. The intermediate region 1050 lies within the region of the first two line scans 940 and 960 or within a start region. The confocal spectroscopic reflectometer 600 performs a third line scan 1040 along the lower horizontal edge of the intermediate region 1050. FIG. 10b exemplifies the intensity profile along the third line scan 1040. Thereupon, the reflectometer 600 performs a fourth line scan 1060 along the right-hand vertical edge of the intermediate region 1050. The reflected intensity detected during the fourth line scan 1060 by the spectrometer 675 of the reflectometer 600 is depicted in FIG. 10c in normalized form. The evaluation of the measurement data recorded by the line scans 1040 and 1060 is carried out as described above in conjunction with the discussion relating to FIG. 9.

If the accuracy of the estimate of the reference point 920 of the alignment mark 530 is sufficient for the use of the second device 560 in FIG. 5, the reference point 920 is determined with the aid of the second device 560. However, if the estimate of the reference point 920 still is greater than a predetermined threshold, the estimate of the reference point 920 can be refined further by further line scans (not depicted in FIG. 10a).

Instead of performing the third 1040 and fourth line scan 1060, the computer or control unit 570 can have a memory (not shown in FIGS. 5 and 6) in which reference marks are stored. These reference marks can reproduce more details about the first 905 and second element 910 of the alignment mark 530 than the first 940 and the second line scan 960 can resolve and they can therefore be used for improving the estimate of the reference point 920 of the alignment mark 530. Furthermore, it is possible to use four 940, 960, 1040, 1060 or more line scans together with stored reference marks for a refined estimate of the reference point 920 of the alignment mark 530.

The uncertainty in the estimate of the reference point 920 that suffices for the use of the second device 560 depends on the type of second device 560 in FIG. 6 and the size of the field of view thereof. In general, an estimate of the reference point 920 of the alignment mark 530 with a full width at half maximum (FWHM) below 20 µm is sufficient to terminate the use of the first device 550 (the confocal spectroscopic reflectometer 600 in the example of FIG. 6) and determine the reference point 920 of the alignment mark 530 using the second device 560.

Figure 11:
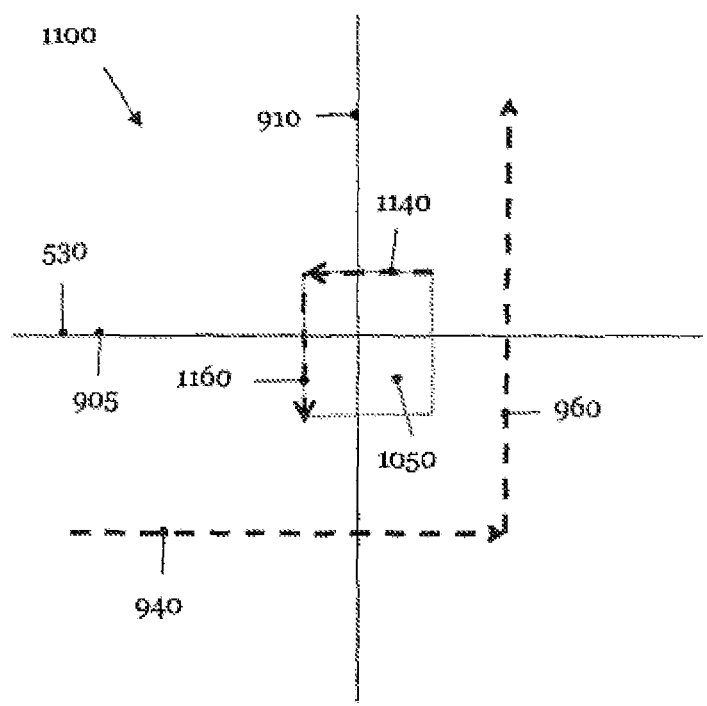
FIG. 11 presents an alternative profile of the third and of the fourth line scan.
Figure 12:
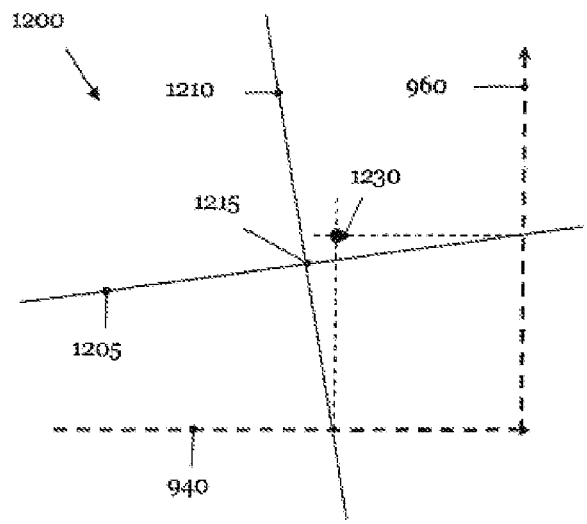
FIG. 12 shows an alignment mark which is skewed in relation to the directions of the first and the second line scan.

In the case of point-symmetrical alignment marks, such as the alignment mark 530, it may be advantageous to perform the third and fourth line scan as depicted in FIG. 11. If the third line scan 1140 is carried out in the specified direction along the upper horizontal edge of the intermediate region 1050 and the fourth line scan 1160 is carried out along the left-hand vertical edge of the intermediate region 1050, the reference point 920 of the alignment mark 530 can be established with greater accuracy from the four signals of the line scans 940, 960, 1140 and 1160 of the spectrometer 675, and, moreover, it is possible to determine a rotation of the alignment mark 530 in relation to the directions of the line scans 940, 960, 1140 and 1160.

Figure 13:
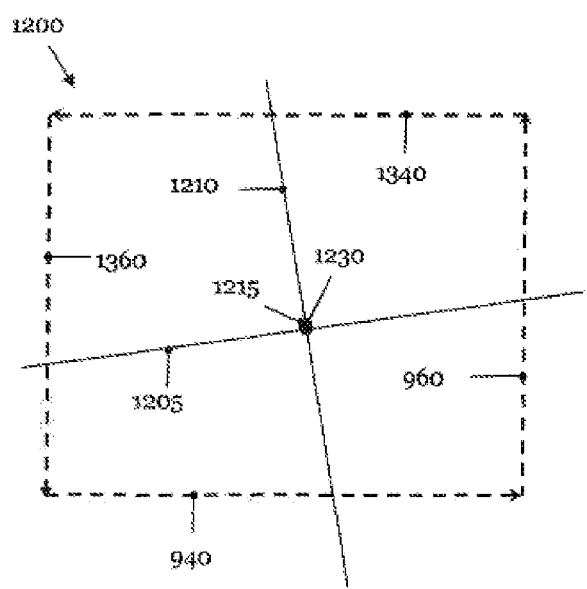
FIG. 13 specifies a third and a fourth line scan in a start region around an estimate of a reference point of the alignment mark such that the reference point for an alignment mark can be established with the aid of the first two line scans of FIG. 12 and the third and fourth line scan.

If the exemplary alignment mark 1200 with the first 1205 and the second element 1210 is present in a skewed manner in relation to the directions of the first 940 and the second line scan 960, the reference point 1230 established from the line scans 940 and 960 lies far away from the actual reference point 1215 of the alignment mark 1200. In this case, it is possible—as depicted schematically in FIG. 13—to determine the actual reference point 1215 of the alignment mark 1200 with the greatest possible accuracy if a third line scan 1340 is performed, which adjoins the second line scan 960 and which is preferably carried out in the opposite direction to the first line scan 940. Finally, a fourth line scan 1360 is performed proceeding from the endpoint of the third line scan 1340, which fourth line scan—as exemplified in FIG. 13—preferably ends at the start point of the first line scan. The reference point 1230 established from the four line scans 940, 960, 1340 and 1360 already lies close to the actual reference point 1215 of the alignment mark 1200.

When the alignment mark 1200 is skewed in relation to the first two line scans 940 and 960, it is generally advantageous to perform four line scans around the estimated reference point of an alignment mark in the start region, wherein the third and the fourth line scan should be carried out as close as possible to the outer boundary of the start region.

Figure 14:
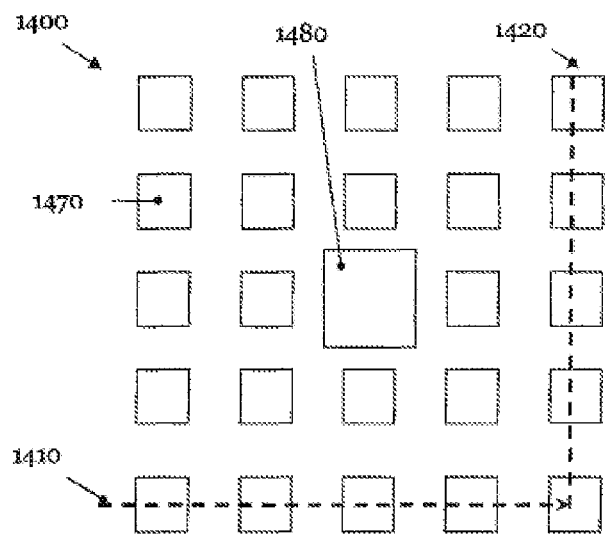
FIG. 14 specifies an alignment mark, which is arranged in an ambiguous region of a mask substrate, and depicts a first and a second line scan.

FIG. 14 exemplifies a reference mark or an alignment mark 1480 in the form of a square which is embedded in a regular arrangement of smaller squares 1470. Hence, the arrangement 1400 is ambiguous since it is not possible to establish a reference point for the alignment mark 1480 after the first 1410 and the second line scan 1420. Even after a third 1530 and a fourth line scan 1540, it still is not possible to determine a reference point for the alignment mark 1480 of the arrangement 1400—as depicted in the example of FIG. 15.

Figure 15:
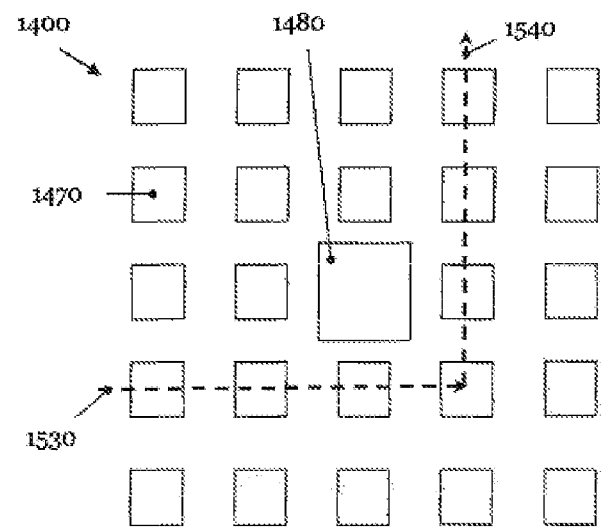
FIG. 15 exemplifies a third and a fourth line scan for resolving the ambiguity in FIG. 14.
Figure 16:
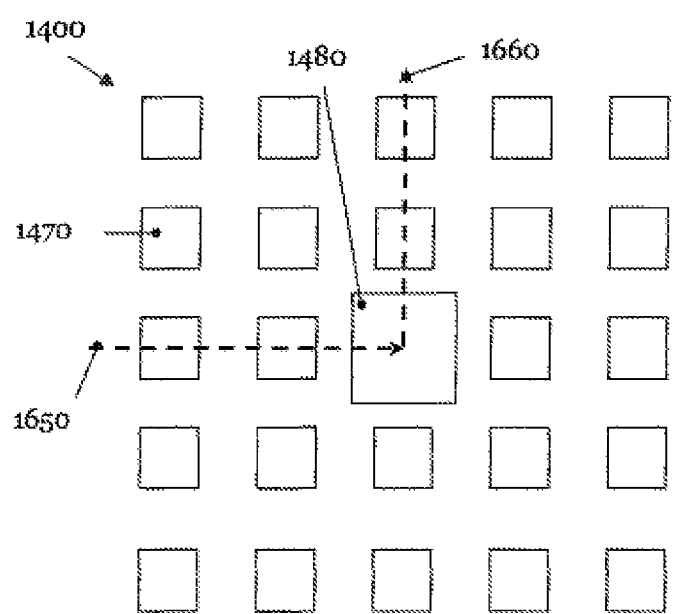
FIG. 16 represents a fifth and a sixth line scan for resolving the ambiguity in FIG. 14.

However, the systematic application of the defined method for determining a reference point of an alignment mark leads to the resolution of the ambiguity in the exemplary arrangement 1400 after the fifth 1650 and the sixth systematic line scan 1660, as exemplified in FIGS. 14 to 16. Hence, a reference point for the alignment mark 1480 of the arrangement 140 can be determined unambiguously after a total of six line scans 1410, 1420, 1530, 1530, 1650 and 1660 in the example of FIGS. 14 to 16.

Figure 17:
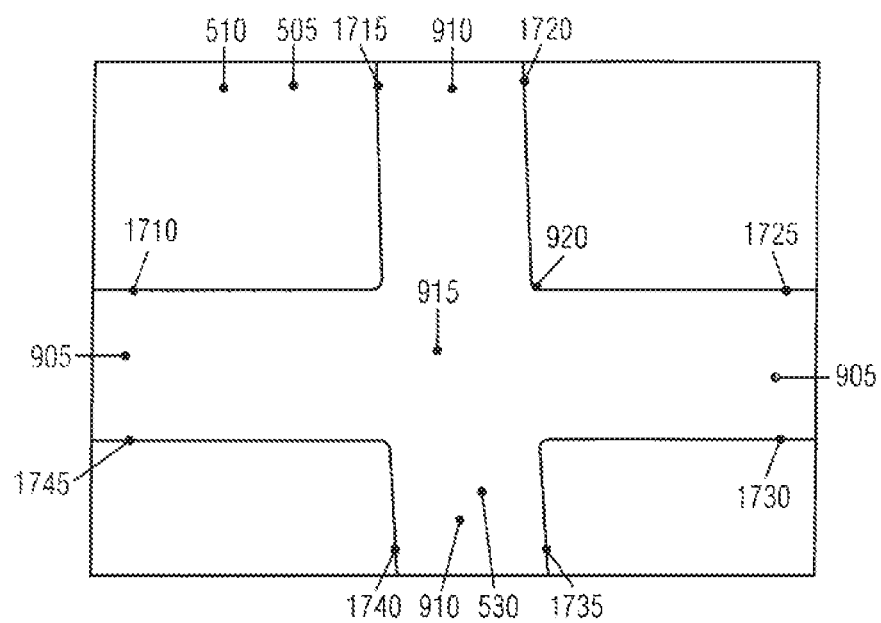
FIG. 17 shows the center of the alignment mark of FIGS. 9*a*, 10*a*, 11, 12 and 13 in the image of a scanning electron microscope.

FIG. 17 shows the center 915 as well as the first element 905 and the second element 910 of the alignment mark 530 on the substrate 505 of the photomask 510, which was recorded using the second device 560. In the example of the image in FIG. 17, the second device 560 was a scanning electron microscope. It is also possible to use a focused ion beam microscope or a light microscope, which uses light from the ultraviolet range of the electromagnetic spectrum, as a second device 560. Moreover, it is possible to use an atomic force microscope (AFM) or modifications of this microscope type as a second device 560.

As already mentioned previously, the alignment mark 530 is etched into the absorber material of the photomask 510 in the example discussed here. It is for this reason that the scanning electron microscope can depict a topology contrast and a material contrast, which is produced at the edges 1710-1745 of the first 905 and the second element 910 of the alignment mark 530 to the substrate 505 of the mask 510. The interference structures in FIG. 17, just like in the subsequent FIGS. 18 and 19, are artifacts which are produced when printing the images.

Figure 18:
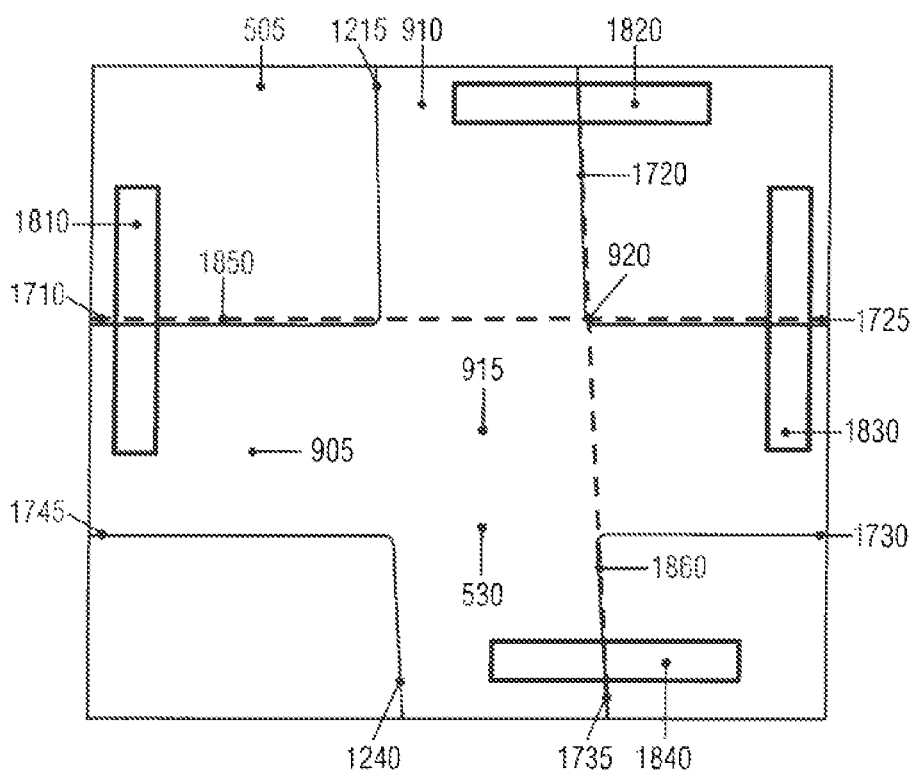
FIG. 18 depicts the scanning regions of the scanning electron microscope for determining the reference point of the alignment mark.
Figure 19:
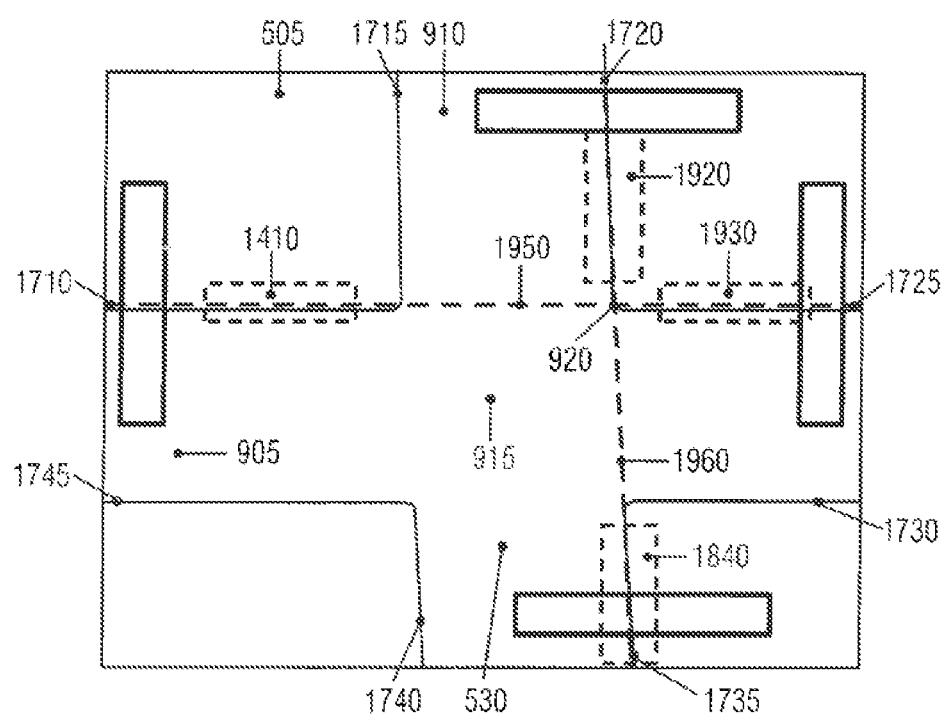
FIG. 19 specifies possible scans of the scanning electron microscope for refining the determination of the reference point of the alignment mark.

FIG. 18 depicts the four scanning regions 1810, 1820, 1830 and 1840 of the scanning electron microscope in the region of the image in FIG. 17, which are used to determine the reference point 920 of the alignment mark 530. In the individual scanning regions 1810, 18320, 1830 and 1840, the scanning electron microscope or, more generally, the second device 560 establishes the profile of the edges 1710, 1720, 1725 and 1735 of the first 905 and the second element 910 of the alignment mark 530. The profiles of the edges 1710, 1720, 1725 and 1735 in the scanning regions 1810, 1820, 1830 and 1840 are transmitted to the computer or control unit 570 by the scanning electron microscope. The computer or control unit 570 determines the connection line 1850 from the data of the scanning regions 1810 and 1830, i.e. from the profiles of the edges 1710 and 1725, and the connection line 1860 from the data of the scanning region 1820 and 1840 or from the profiles of the edges 1720 and 1735. The computer and control unit establishes the reference point 920 of the alignment mark 530 from the intersection of the connection lines 1850 and 1860.

If necessary, the accuracy of the determination of the reference point 920 of the alignment mark 530 can be improved. This process is specified schematically in FIG. 19. To this end, the edges 1710 and 1725 of the first element 905 of the alignment mark 530 are scanned over a relatively long region by the scanning regions 1910 and 1930. Furthermore, the edges 1720 and 1735 of the second element 905 of the alignment mark 530 are likewise scanned over a relatively long path distance by the scanning regions 1920 and 19440. The profile of the edges 1710 and 1725 as well as the edges 1720 and 1735 are transmitted to the computer and control unit 570 by the scanning electron microscope. From this data, said computer and control unit determines the connection lines 1950 and 1960 which have a smaller measurement error than the connection lines 1850 and 1860. Hence, the refining step depicted in FIG. 19 renders it possible to increase the precision of the determination of the reference point 920 of the alignment mark in relation to the embodiment explained on the basis of FIG. 18.

The presented method renders it possible to determine a reference point of an alignment mark of a substrate of a photomask without a manual search process, even if the variation of the alignment mark reaches the region of millimeters from photomask to photomask.

The invention claimed is:

1. A method for automated determination of a reference point of an alignment mark on a substrate of a photolithographic mask, wherein the method comprises the following steps:
   a. performing a first line scan within a start region of the substrate in a first direction on a surface of the substrate, the alignment mark being arranged within the start region, for locating a first element of the alignment mark;
   b. performing a second line scan within the start region in at least a second direction, which intersects the first direction, on the surface of the substrate for locating a second element of the alignment mark;
   c. estimating the reference point of the alignment mark from the located first element and the located second element of the alignment mark; and
   d. imaging a target region around the estimated reference point of the alignment mark in order to determine the reference point of the alignment mark, with the imaging being carried out at a higher resolution than the performance of the line scans in steps a. and b.

2. The method as claimed in claim 1, furthermore comprising the following steps:
   e. performing a third and fourth line scan within an intermediate region around the estimate of the reference point of the alignment mark after step c., with the intermediate region being smaller than the start region and larger than the target region;
   f. re-estimating the reference point of the alignment mark from renewed locating of the first element and the second element of the alignment mark by the third line scan and fourth line scan; and
   g. performing step d. using the new estimate of the reference point.

3. The method as claimed in claim 2, furthermore comprising the following step: repeating steps e. to f. for renewed estimation of the reference point with a position inaccuracy below a predetermined threshold.

4. The method as claimed in claim 3, wherein the predetermined threshold is 100 μm, preferably 20 μm, more preferably 5 μm and most preferably 1 μm.

5. The method as claimed in claim 1, furthermore comprising the following steps:
   h. performing a third and fourth line scan within the start region and outside of an intermediate region around the estimate of the reference point of the alignment mark after step c., with the intermediate region being smaller than the start region and larger than the target region;
   i. re-estimating the reference point of the alignment mark from renewed locating of the first element and the second element of the alignment mark by the third line scan and fourth line scan; and
   j. performing step d. using the new estimate of the reference point.

6. The method as claimed in claim 1, wherein step c. of the method comprises the following: comparing the first line scan and the second line scan with stored reference marks.

7. The method as claimed in claim 1, wherein the reference point is determined with a position inaccuracy of <10 µm, preferably <1 µm, more preferably <300 nm and most preferably <100 nm.

8. The method as claimed in claim 1, furthermore comprising the following steps:
   k. shifting the start region if no reference point is estimated in step c.; and
   l. repeating steps a., b. and c.

9. The method as claimed in claim 1, wherein performing the first and the second line scan comprises the use of a confocal spectroscopic reflectometer.

10. The method as claimed in claim 9, wherein performing the first and the second line scan comprises the use of the confocal spectroscopic reflectometer without preceding focusing.

11. The method as claimed in claim 9, furthermore comprising the following step: setting the signal-to-noise ratio of the first and the second line scan by means of the distance between the substrate of the photolithographic mask and an output lens of the confocal spectroscopic reflectometer.

12. The method as claimed in claim 1, wherein the imaging of the target region comprises the use of a scanning electron microscope and/or a focused ion beam microscope and/or a light microscope.

13. A device for automated determination of a reference point of an alignment mark on a substrate of a photolithographic mask, comprising:
   a. means for performing a first line scan and a second line scan within a start region of the substrate in a first direction on a surface of the substrate, with the alignment mark being arranged within the start region, for locating a first element and a second element of the alignment mark;
   b. means for estimating the reference point of the alignment mark from the first and the second element of the alignment mark; and
   c. means for imaging a target region around the estimated reference point of the alignment mark for determining the reference point of the alignment mark, wherein the means for imaging the target region has a higher resolution than the means for performing the first line scan and the second line scan.

14. The device as claimed in claim 13, wherein the means for performing a first line scan and a second line scan has a lateral spatial resolution <100 µm, preferably <50 µm, more preferably <20 µm and most preferably <10 µm.

15. The device as claimed in claim 13, wherein the means for performing a first line scan and a second line scan comprises means for local scanning of the surface of the substrate.

16. The device as claimed in claim 13, wherein the means for performing a first line scan and a second line scan comprises:
   d. a sensor embodied to direct focused electromagnetic radiation onto the substrate and receive electromagnetic radiation reflected and/or transmitted by the substrate;
   e. a scanning unit embodied to scan the sensor and/or the substrate in a plane perpendicular to the focused electromagnetic radiation; and
   f. a control unit connected to the sensor and embodied to determine a local intensity distribution from the electromagnetic radiation received by the sensor.

17. The device as claimed in claim 16, wherein the control unit is furthermore connected to the scanning unit and embodied for open-loop or closed-loop control of the scanning unit.

18. The device as claimed in claim 16, wherein the scanning unit has a spatial resolution <20 µm, preferably <10 µm, more preferably <1 µm and most preferably <0.5 µm.

19. The device as claimed in claim 16, wherein the sensor comprises a confocal spectroscopic reflectometer.

20. The device as claimed in claim 19, wherein the sensor is embodied to perform the first and second line scan without preceding focusing.

21. The device as claimed in claim 19, wherein the signal-to-noise ratio of the first and the second line scan is set by means of the distance between the substrate of the photolithographic mask and an output lens of the confocal spectroscopic reflectometer.

22. The device as claimed in claim 16, wherein the means for imaging the target region has a spatial resolution <200 nm, preferably <50 nm, more preferably <10 nm and most preferably <2 nm.

23. The device as claimed in claim 16, wherein the means for imaging the target region comprises a scanning electron microscope and/or a focused ion beam microscope and/or a light microscope.

24. The device as claimed in claim 16, wherein the means for estimating the reference point of the alignment mark comprises a processor configured to estimate the reference point of the alignment mark from the located first and second elements and/or to determine the reference point of the alignment mark from the imaging of the target region.

25. The device as claimed in claim 16, wherein the means for estimating the reference point of the alignment mark comprises a memory for storing reference marks.

* * * * *

UNITED STATES PATENT AND TRADEMARK OFFICE
CERTIFICATE OF CORRECTION

PATENT NO. : 9,863,760 B2
APPLICATION NO. : 14/899979
DATED : January 9, 2018
INVENTOR(S) : Michael Budach, Ralf Schönberger and Michael Jöst Page 1 of 1

It is certified that error appears in the above-identified patent and that said Letters Patent is hereby corrected as shown below:

In the Claims

Column 15
Line 14 (Approx.), in Claim 9, delete "claim l" and insert -- claim 1 --

Signed and Sealed this
Twenty-fifth Day of June, 2019

Andrei Iancu
*Director of the United States Patent and Trademark Office*